US007263675B2

(12) United States Patent
Dargelas

(10) Patent No.: US 7,263,675 B2
(45) Date of Patent: Aug. 28, 2007

(54) TUPLE PROPAGATOR AND ITS USE IN ANALYSIS OF MIXED CLOCK DOMAIN DESIGNS

(75) Inventor: Alain M. Dargelas, Milpitas, CA (US)

(73) Assignee: Synopsys, Inc., Mountain View, CA (US)

( * ) Notice: Subject to any disclaimer, the term of this patent is extended or adjusted under 35 U.S.C. 154(b) by 320 days.

(21) Appl. No.: 10/869,488

(22) Filed: Jun. 15, 2004

(65) Prior Publication Data

US 2005/0273735 A1 Dec. 8, 2005

Related U.S. Application Data

(60) Provisional application No. 60/577,318, filed on Jun. 3, 2004.

(51) Int. Cl.
*G06F 17/50* (2006.01)
(52) U.S. Cl. ........................................................ 716/4
(58) Field of Classification Search .................. 716/5, 716/4; 714/726, 738
See application file for complete search history.

(56) References Cited

U.S. PATENT DOCUMENTS

| | | | | |
|---|---|---|---|---|
| 5,132,974 | A * | 7/1992 | Rosales | 714/731 |
| 5,650,938 | A | 7/1997 | Bootehsaz et al. | 364/490 |
| 5,657,239 | A * | 8/1997 | Grodstein et al. | 716/6 |
| 5,737,341 | A * | 4/1998 | Hosokawa | 714/726 |
| 5,938,785 | A | 8/1999 | Dargelas | 714/744 |
| 6,510,535 | B1 * | 1/2003 | Hosokawa et al. | 714/726 |
| 6,567,961 | B2 | 5/2003 | Jacob | 716/6 |
| 6,651,206 | B2 * | 11/2003 | Hosokawa et al. | 714/738 |
| 6,735,730 | B1 * | 5/2004 | Fujiwara et al. | 714/726 |
| 2003/0188245 | A1 * | 10/2003 | Abramovici et al. | 714/738 |
| 2004/0130313 | A1 * | 7/2004 | Xiang et al. | 324/158.1 |
| 2004/0153978 | A1 * | 8/2004 | Xiang et al. | 716/3 |
| 2005/0060678 | A1 * | 3/2005 | Hasegawa et al. | 716/11 |
| 2005/0235186 | A1 * | 10/2005 | Wang et al. | 714/728 |

OTHER PUBLICATIONS

Xiang et al., 'Non-Scan Design for Testibility for Synchronous Sequential Circuits Based on Conflict Analysis', ITC International Test Conference, 2000 IEEE, pp. 520-529.*
Coudert et al. 'A Unified Framework for the Formal Verification of Sequential Circuits', Proceedings of the 1990 Inernational Conference on Computer-Aided Design. 1990 IEEE, pp. 126-129.*
Dwarakanath et al. 'Universal Fault Simulation Using Fault Tuples'. in Proc. Design Automation Conference, 2000, pp. 786-789.*
DeVane, Charles J. 'Efficient Circuit Partitioning to Extend Cycle Simulation Beyond Synchronous Circuits', Proc. ICCAD. San Francisco 1997.*

* cited by examiner

Primary Examiner—Jack Chiang
Assistant Examiner—Suchin Parihar
(74) Attorney, Agent, or Firm—Silicon Valley Patent Group LLP; Omkar Suryadevara

(57) ABSTRACT

Names of signals are propagated through a circuit design inside tuples, with each tuple including at least a signal name and a sequential depth. A tuple being propagated is added to a list of zero or more tuples currently identified with a circuit element, unless a tuple of the same signal name is already present in the list. If already present in the list, then propagation of that tuple is stopped. Propagation of tuples may also be stopped depending on user-defined limits, e.g. on sequential depth. Tuple propagation may be used, depending on the embodiment, to identify features of interest in the circuit design, e.g. (a) a point of convergence of differently clocked signals, (b) location of gray coders, and (c) location of synchronizers, by appropriate identification of circuit elements from which tuple propagation is to start, and by appropriate checks on lists of tuples that result from tuple propagation.

20 Claims, 15 Drawing Sheets

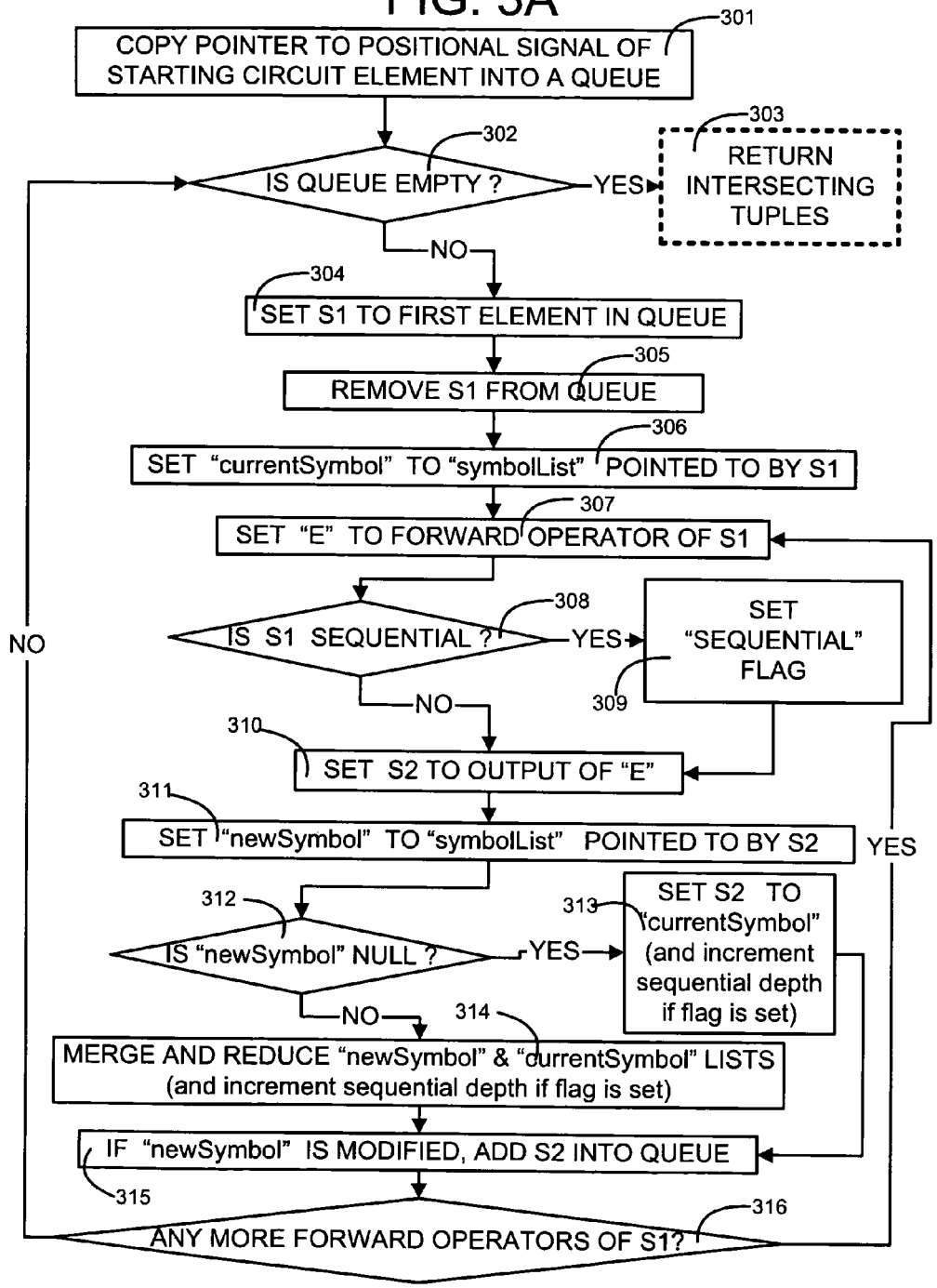

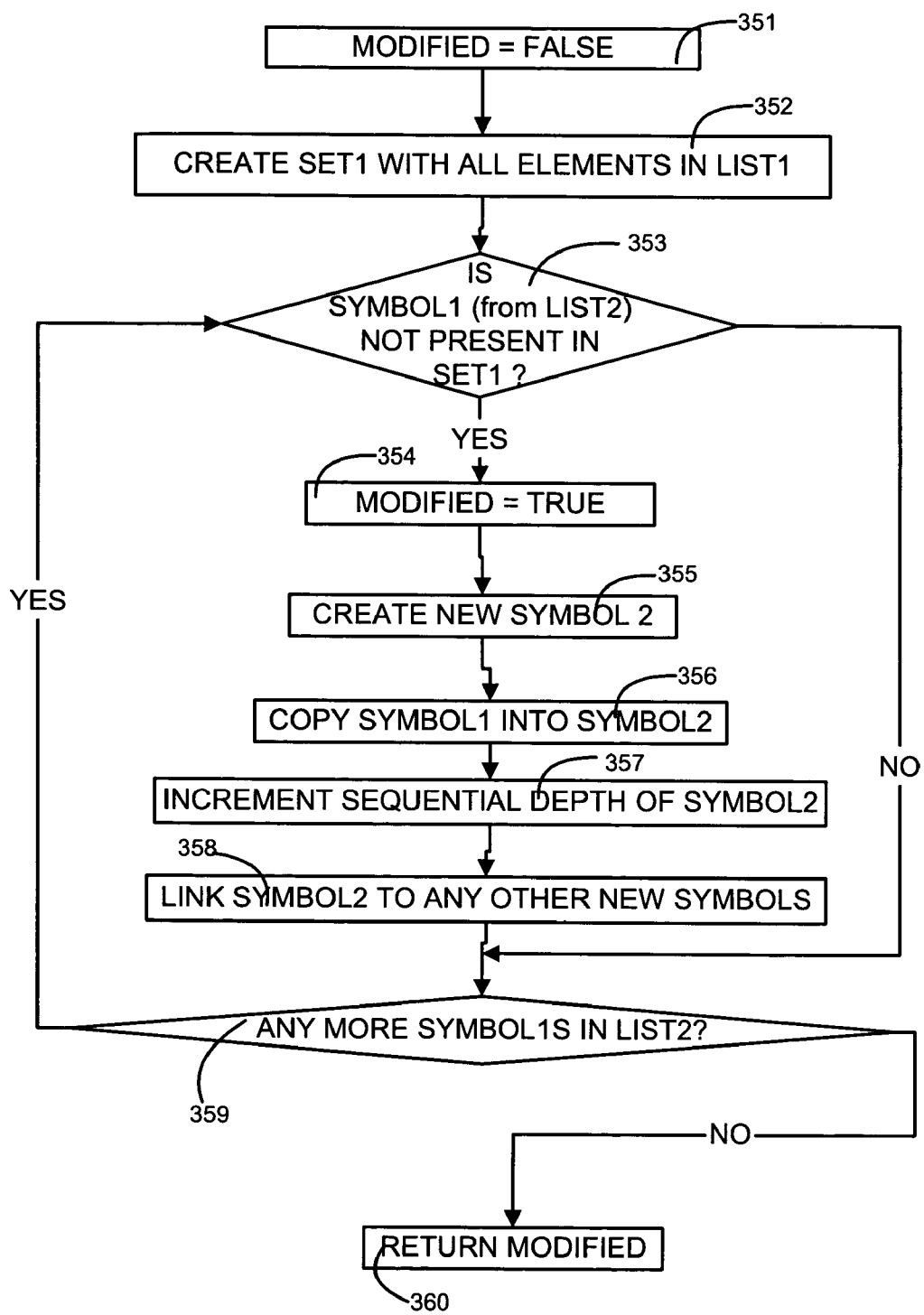

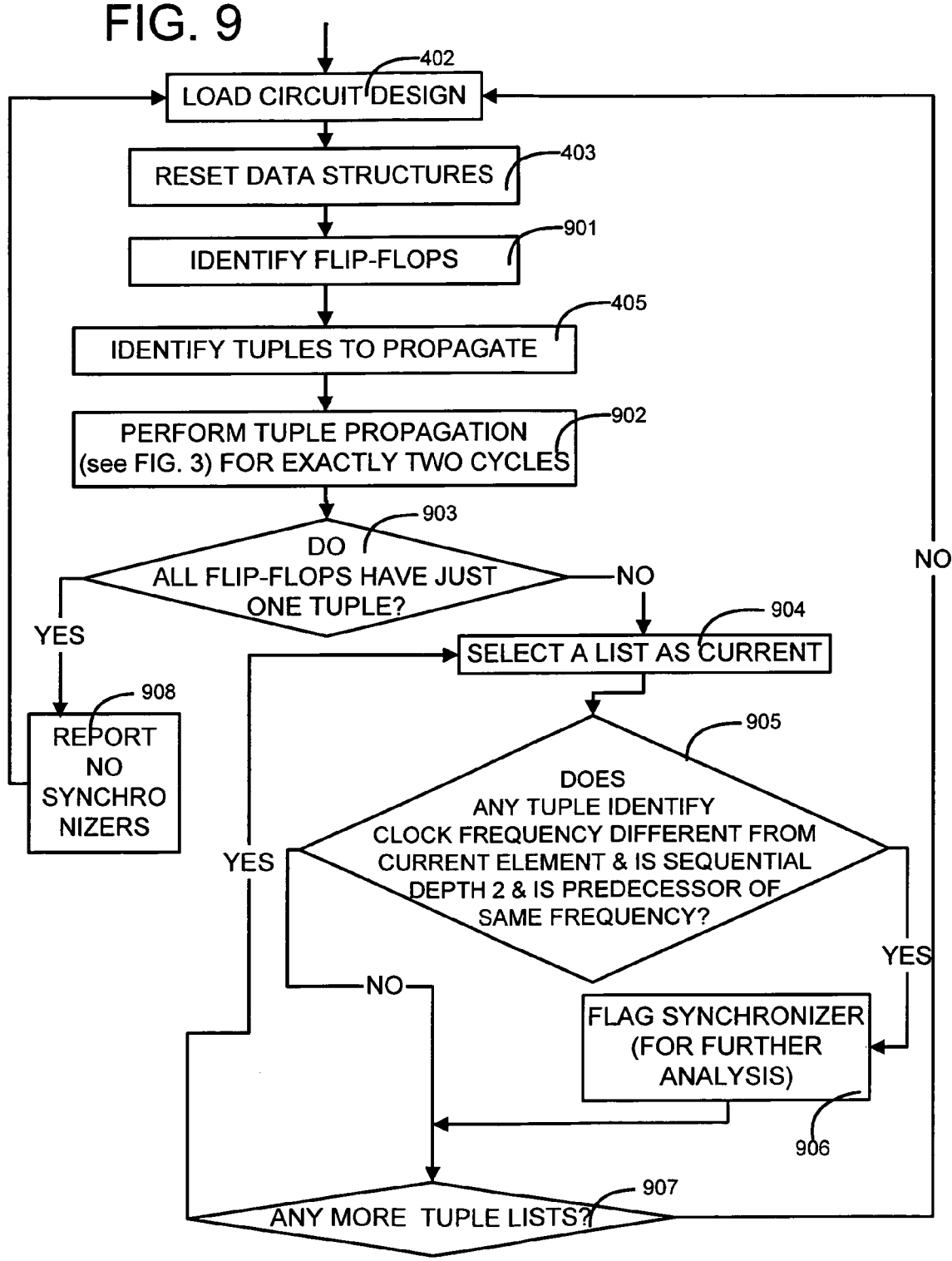

TUPLE PROPAGATOR AND ITS USE IN ANALYSIS OF MIXED CLOCK DOMAIN DESIGNS

CROSS-REFERENCE TO PROVISIONAL APPLICATION

This application claims priority under 35 USC § 119 (e) from a provisional application No. 60/577,318 filed on Jun. 3, 2004 having the title TUPLE PROPAGATOR AND ITS USE IN CONVERGENCE ANALYSIS, filed by Alain M. Dargelas, which is incorporated by reference herein in its entirety.

CROSS-REFERENCE TO COMPUTER PROGRAM LISTING APPENDIX

Appendix A contains the following files in one CD-ROM (of which two identical copies are attached hereto), and is a part of the present disclosure and is incorporated by reference herein in its entirety.

```
Volume in drive D is 040615_1241
Volume Serial Number is E8CC-C7D9
Directory of D:\
06/15/2004  12:17p      10,019 EMBOD1.TXT
06/15/2004  12:16p      12,362 EMBOD2.TXT
06/15/2004  12:16p      10,545 PROPGT.TXT
         3 File(s)     32,926 bytes
         0 Dir(s)       0 bytes free
```

The file PROPGT.TXT contains source code for a computer program written in the C++ language for a Tuple Propagator as described below. Files EMBOD1.TXT and EMBOD2.TXT respectively contain source code for two computer programs written in the C++ language for use of the Tuple Propagator, as described below in two embodiments of the invention. The attached CD-ROMs are in IBM-PC format and are compatible with Microsoft MS-Windows.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Field of the Invention

The invention relates to design of semiconductor chips. More specifically, the invention relates to a method and an apparatus for propagating tuples through a representation of a circuit design and use of propagated tuples to identify a point of convergence of signals clocked at different frequencies.

2. Related Art

FIG. 1A illustrates a circuit design in which signals Q1 and Q2 from two flip-flops 101 and 102 that are respectively clocked by signals ClkA and ClkB travel through a number of flip-flops that are clocked by yet another signal ClkC. In the circuit design of FIG. 1A, it is typical to include flip-flops 103-106 as "synchronizers" followed by additional flip-flops 107-112 as "pipeline stages."

In such a circuit design, it is not easy to identify exactly where the signals Q1 and Q2 converge (or to identify whether or not they converge at all). Automatic identification of AND gate n100 (FIG. 1A) as a point of convergence of the two signals is useful in determining whether or not a sufficient number of flip-flops (clocked by signal ClkC) have been traversed. If the number of flip-flops that are traversed before convergence of signals Q1 and Q2 is less than a predetermined number (e.g. less than two flip-flops or three flip-flops), then metastability can occur.

Since metastability is to be avoided, currently there is a need to identify the sequential depth at which such signal convergence occurs in designs of integrated circuits (ICs), such as graphics chips that may contain millions of gates (e.g. 35 million gates). Conventional methods that have complexity on the order of $N^2$ (where N is the number of gates) are unable to find points of signal convergence in a reasonable duration of time during circuit design, when such methods are executed in computers currently used for analyzing and simulating circuit designs, such as a Sun workstation.

U.S. Pat. Nos. 5,938,785, 6,567,961 and 5,650,938 are incorporated by reference herein in their entirety as background.

FIG. 1B illustrates another circuit design, wherein a sixteen bit bus 162 carries data from flip-flops 161 clocked by a first clock signal clkA to a First-In-First-Out (FIFO) memory 163 that is clocked by a second clock signal clkB. Note that for simplicity of the drawing, only one flip-flop 161 is shown on the left side of bus 162 and only one flip-flop is shown on the right side of bus 162, although it is to be understood that there are sixteen such flip-flops on each side of the bus. Moreover, FIFO 163 has sixteen flip-flops in each of several stages (although only two stages in the form of two flip-flops are shown in FIFO 163 of FIG. 1B).

In a circuit of the type illustrated in FIG. 1B as discussed above, it is common to include a Gray coder 170 clocked at clkA, followed by the following circuit elements that are clocked at clkB: synchronizers 172, a Gray decoder 173, and a state machine 174. The state machine 174 generates an enable signal that is used to enable FIFO 163 to latch a signal from data bus 162. Note that FIFO 163 is enabled by state machine 174 if in the current clock cycle only one single bit changes in the signal received by Gray decoder 173, as compared to the previous clock cycle. If more than one bit changes, then state machine 174 disables the FIFO 163 and the signal on bus 162 is not latched.

The just-described technique is known to minimize or even eliminate errors in transfer of data between the two clock domains (clocked by the respective signals clkA and clkB). However, when such circuitry is designed, it is possible for a circuit designer to fail to include one or more circuit elements, such as synchronizers 172 or some portion of state machine 174. The problem becomes acute when a prior art circuit design contains 100s or 1000s of buses that cross clock domains, such as bus 162. Hence, there is a need to automatically find such errors in circuit design during the design stage, i.e. before the circuit description is prepared into a netlist (for fabrication of an integrated circuit chip).

SUMMARY

Names of certain signals are propagated through a circuit description, in accordance with the invention, in the form of tuples that contain signal names and additional information.

Specifically, each tuple includes at least a name of a signal being propagated and sequential depth of a circuit element through which the signal is being propagated, from a boundary at which the clock frequency changes in the circuit description. Note that a tuple may include other information, such as a position of an element of the circuit description with which the tuple is identified, and/or a frequency at which the signal being propagated was clocked in clock domain in which the signal originates.

Tuple propagation starts from one or more elements (also called "starting elements") in the circuit description (such as gates or flip-flops), proceeds through elements to which each starting element is immediately connected, and proceeds further through elements to which the just-described elements are immediately connected and so on, up to a predetermined depth in terms of elements that are clocked (also called "sequential depth"). During such propagation, if an element is not currently identified with any tuple, then the tuple being propagated is identified with the element. If the element is currently identified with at least another tuple, then a check is made as to whether the tuple being propagated differs from every tuple currently identified with the element.

If the result of the just-described check is true, then an operation (called "merge and reduce") is performed between a first list that contains the tuple being propagated and a second list that is associated with the current element. During this operation, a combined list is formed to include non-redundant tuples from the two lists. Note that tuples are considered redundant (i.e. identical) if all information except sequential depth is identical. If the tuple being propagated is identical to a tuple identified with the current element, then that tuple is no longer propagated, and the sequential depth at the current element is set to be smaller of the sequential depths in the two redundant tuples. If a current element through which a tuple is being propagated is clocked (e.g. if it is a flip-flop), the sequential depth in the tuple is incremented by one.

After tuple propagation is completed through all elements that can be reached in the above-described manner, each element of the circuit which is currently identified with multiple tuples may be analyzed further depending on the embodiment. Specifically, in a first embodiment, tuple propagation starts from a last flip-flop in each synchronizer. In this first embodiment each element that has at least two tuples of different clock frequencies is flagged if the element is located at a sequential depth less than a predetermined limit on sequential depth that is set by the user. In this first embodiment, the flagged elements are deemed to be subject to metastability, and subject to re-design by a circuit designer. Note that in the just-described first embodiment, propagation of tuples is also limited by the predetermined limit on sequential depth.

In a second embodiment, flip-flops that transmit a signal that crosses clock domains as well as the last flip-flop in each synchronizer are used as starting elements. In this second embodiment, each element that has exactly five tuples is flagged if four tuples have the same clock frequency as one another, and a fifth tuple has a different clock frequency and the fifth tuple has sequential depth 1. The flagged element in the second embodiment represents a first flip-flop in a First-In-First-Out (FIFO) memory which has preceding it a stage machine, a gray decoder, synchronizers and a gray encoder. Therefore such flagged element of the second embodiment enables its predecessor elements to be analyzed for mistakes by the circuit designer (e.g. by formal analysis).

In a third embodiment, all flip-flops are used as starting elements, and tuples are propagated across just two elements that are clocked (i.e. two sequential stages), and the resulting tuple lists are analyzed as follows. If any tuple in the third embodiment identifies a clock frequency different from the clock frequency of a current element with which it is associated, and if the sequential depth of the current element is 2 and if the predecessor element is also clocked at the same frequency as the current element, then these two elements are flagged as forming a synchronizer. The existence of a synchronizer as identified by the third embodiment is used in further analysis (e.g. of the type described above).

BRIEF DESCRIPTION OF THE FIGURES

FIG. 3A illustrates, in a low-level flow chart, acts performed by a computer to propagate tuples in some embodiments of the invention.

FIG. 3B illustrates, in another low-level flow chart, acts performed by the computer to merge two lists of tuples as per act 314 in FIG. 3A.

FIG. 9 illustrates, in a high-level flow chart, acts performed to use the method of FIGS. 3A and 3B to identify synchronizers in a mixed clock domain circuit.

DETAILED DESCRIPTION

A computer is programmed in accordance with this invention to propagate in a digital circuit representation, at least a pair (which is a 2-tuple) of items namely: (a) name of a wire that carries a signal that crosses clock domains and (b) sequential depth of a circuit element from the boundary of the clock domain. Note that the programmed computer may propagate a pair of (signal/wire name and sequential depth) as a portion of an n-tuple (wherein n is any natural number greater than 1) that may or may not contain other information depending on the embodiment, such as the frequency at which the signal name being propagated was originally clocked prior to entering the current clock domain. Note that it is the name of the signal that is being propagated in accordance with the invention, and not the signal itself (e.g. a logic level of 0 or 1 is not propagated, but the name itself (such as "Q1") is propagated).

Note that a representation of a circuit design (expressed in a Hardware Description Language, e.g. by a circuit designer) in a programmed computer in several embodiments of the invention uses a graph containing a succession of wires (also referred to as "positional signals") and circuit elements (which identify the specific device, e.g. AND gate, or flip-flop). Note that circuit elements are also sometimes referred to as "operators." In some embodiments of the graph, nodes represent the positional signals and edges represent the operators, although in other embodiments such representation may be reversed. Therefore, if a wire is known, then one or more next circuit elements (also called "forward operators") that can be reached from the current wire can be looked up from the graph. And if a circuit element is known, then a wire at its output can be looked up from the graph. Although one representation of the circuit design has been described, any other representation may be used, depending on the embodiment.

Figure 1A:
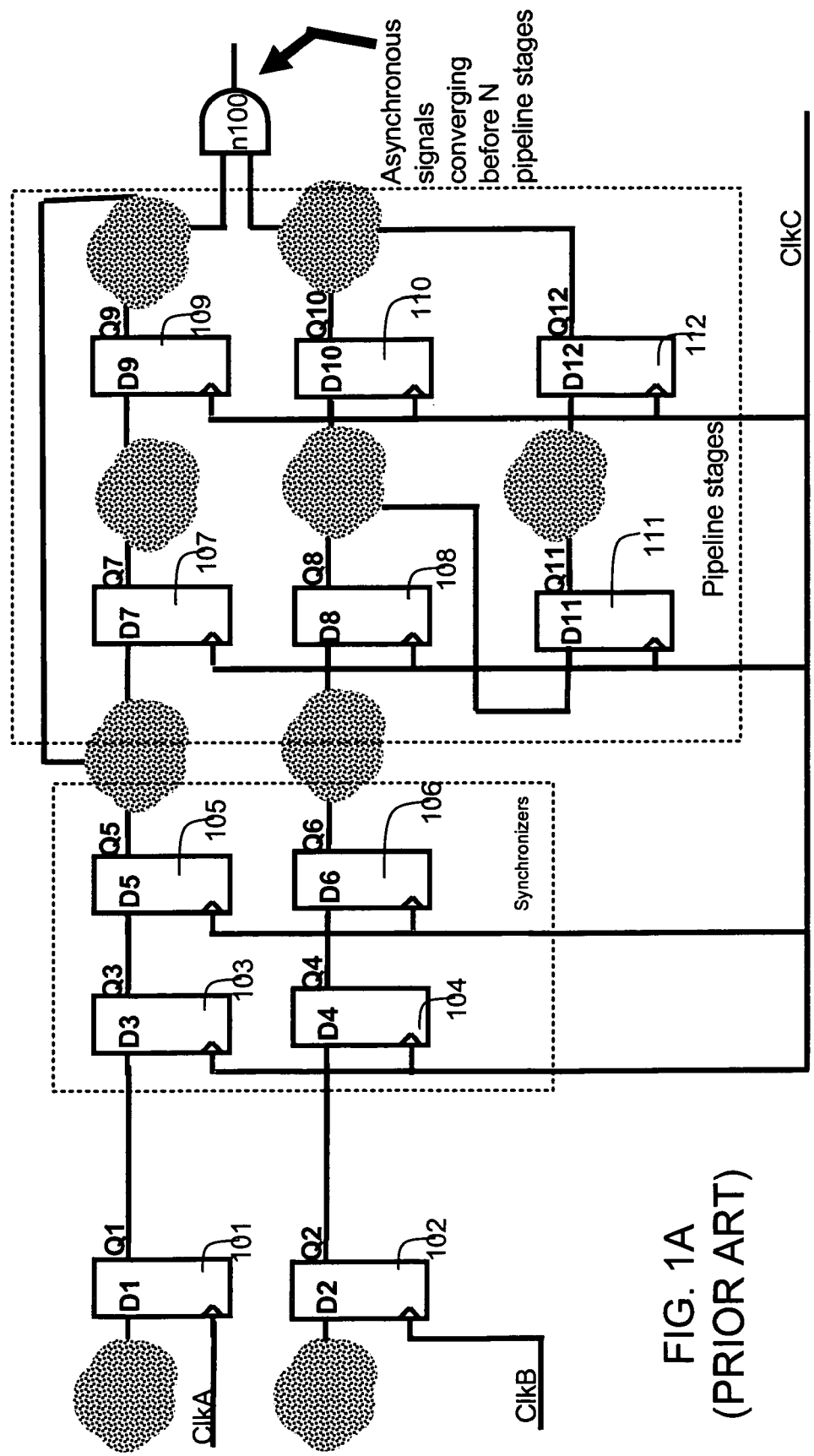
FIG. 1A illustrates, in a block diagram, circuit elements in a prior art circuit design of mixed clock domains.

In the example circuit of FIG. 1A, some embodiments of an appropriately programmed computer in accordance with the invention propagate a 2-tuple as follows: the signal/wire name Q1 is identified in a 2-tuple of flip-flop 103 because Q1 is the signal/wire output of flip-flop 101 in the domain clocked by ClkA, and the sequential depth 0 is also identified in this 2-tuple because flip-flop 103 is the very first flip-flop in the domain clocked by ClkC through which signal Q1 passes. In certain embodiments, a 3-tuple may hold additional information, such as the output wire/signal of a circuit element (e.g. output wire/signal Q1 of flip-flop 103 in the netlist) or the clock frequency ClkA.

Figure 2A:
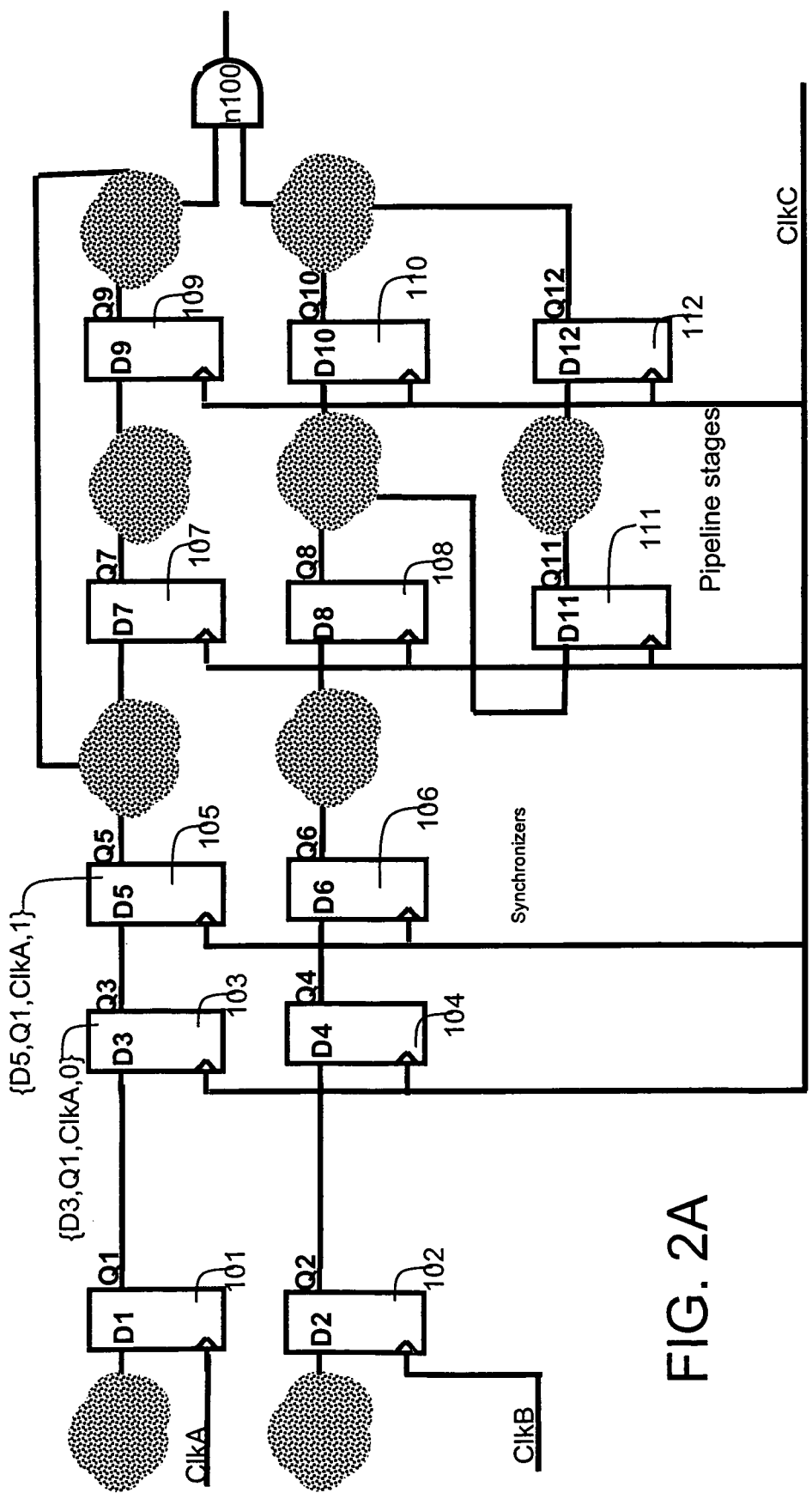
FIGS. 2A-2C illustrate the block diagram of FIG. 1A annotated with tuples that are used in accordance with the invention to propagate signals Q1 and Q2 respectively clocked at ClkA and ClkB through circuit elements that are clocked at ClkC.

One particular embodiment illustrated in FIG. 2A uses a 4-tuple (also called quadruplet) that contains (a) a positional signal [PS], (b) a name of the signal being propagated [SPS], (c) the frequency at which the signal name being propagated was originally clocked [CPS] and (d) the sequential depth [SQD] of the propagated signal name. Another embodiment uses a data structure that is built using the positional signal, and hence the positional signal is not explicitly identified in the tuple, but the tuple is pointed to by a pointer in the data structure for the positional signal.

For illustrative purposes and merely as an instruction tool, the positional signal is included in a 4-tuple shown in the embodiment in FIG. 2A as discussed next. Individual values of the 4-tuple for flip-flop 103 are as follows [PS]=D3, [SPS]=Q1, [CPS]=ClkA, and [SQD]=0. As noted above, the sequential depth is zero because flip-flop 103 is the very first flip-flop in the path of wire/signal name Q1 that is clocked at the new frequency of signal ClkC. Therefore, the tuple {D3, Q1, ClkA, 0} is now associated with flip-flop 103. Next, another such tuple is created at a next circuit element through which the signal name being propagated (e.g. signal name Q1) passes, if there is no signal name that is indicated as already passing through the next circuit element. Initially, since nothing is associated with flip-flop 105, a new tuple is formed as {D5, Q1, ClkA, 1}. In the new tuple, the positional signal is changed to D5 so as to identify flip-flop 105, and the sequential depth is increased. The sequential depth is increased only in case of circuit elements that are clocked.

Figure 2B:
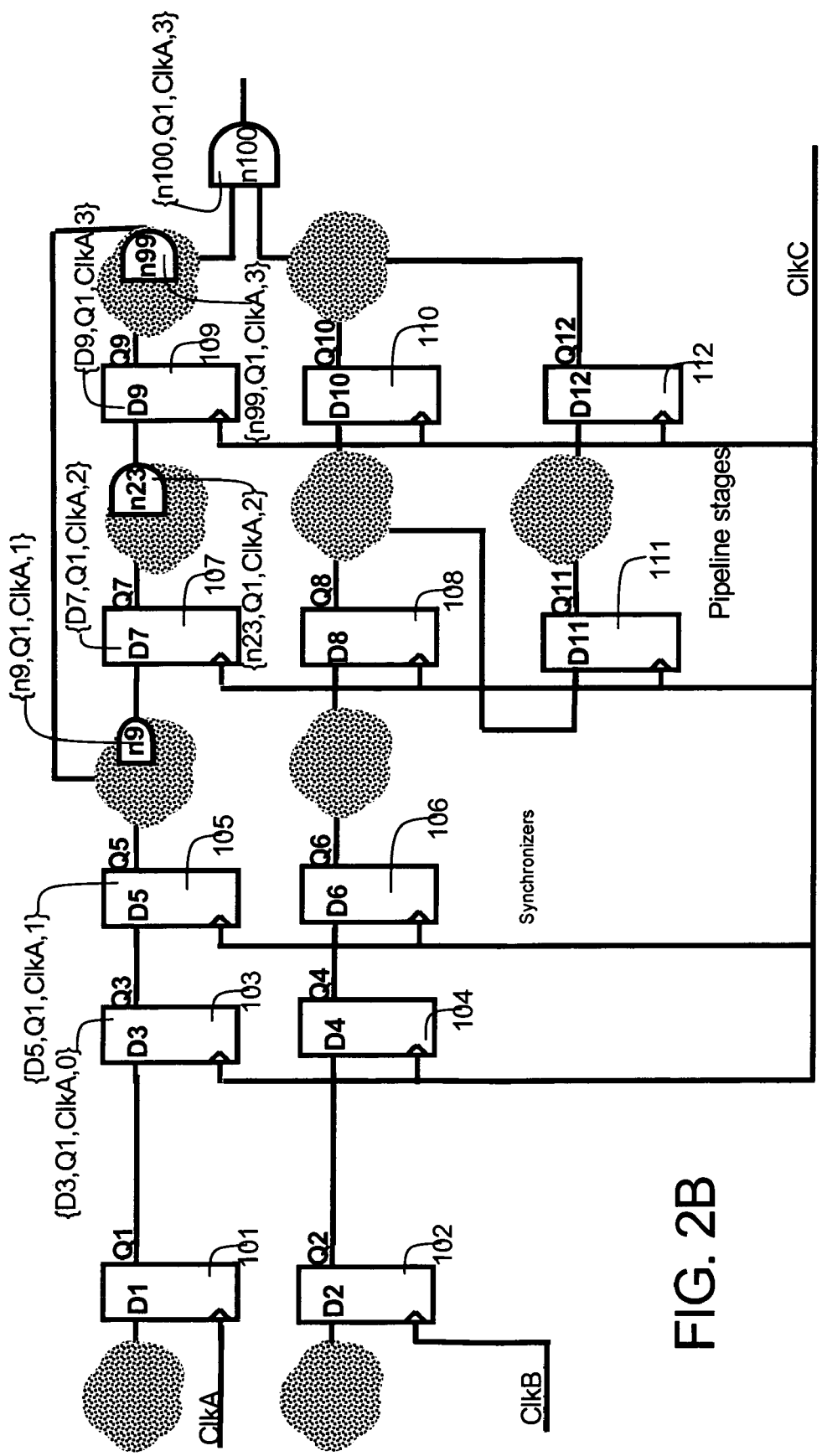

For the just-discussed reason, when the signal name being propagated passes through combinational logic, there is no increase in sequential depth. Hence, as shown in FIG. 2B, the tuple {n9, Q1, ClkA, 1} is associated with AND gate n9. In this manner signal Q1 is propagated through flip-flop 107 which is associated with tuple {D7, Q1, ClkA, 2}, through AND gate n23 which is associated with tuple {n23, Q1, ClkA, 2}, through flip-flop 109 which is associated with tuple {D9, Q1, ClkA, 3}, through AND gate n99 which is associated with tuple {n99, Q1, ClkA, 3}.

After AND gate n99, signal name Q1 is propagated in two directions (1) back to AND gate n9 and (2) forward to AND gate n100. In propagating back to AND gate n9, it is found that AND gate n9 already has a tuple {n9, Q1, ClkA, 1} that is pre-existing and with gate n9. So a check is made as to whether the same signal name Q1 is present in this pre-existing tuple and if so, the signal name Q1 is no longer propagated (in this direction). Note that the tuple associated with gate n9 may be updated if the newincoming sequential depth (from gate n99) is lower. Since the new incoming sequential depth in this particular example is greater (it is 3), no update is made. Signal name Q1 is also propagated to gate n100 in the normal manner, and hence the tuple {n100, Q1, ClkA, 3} is associated with gate n100. Thereafter, propagation of signal name Q1 is continued in this manner until Q1 can no longer be propagated (e.g. Q1 may be propagated until all circuit elements in the fanout of Q1 are reached).

Figure 2C:
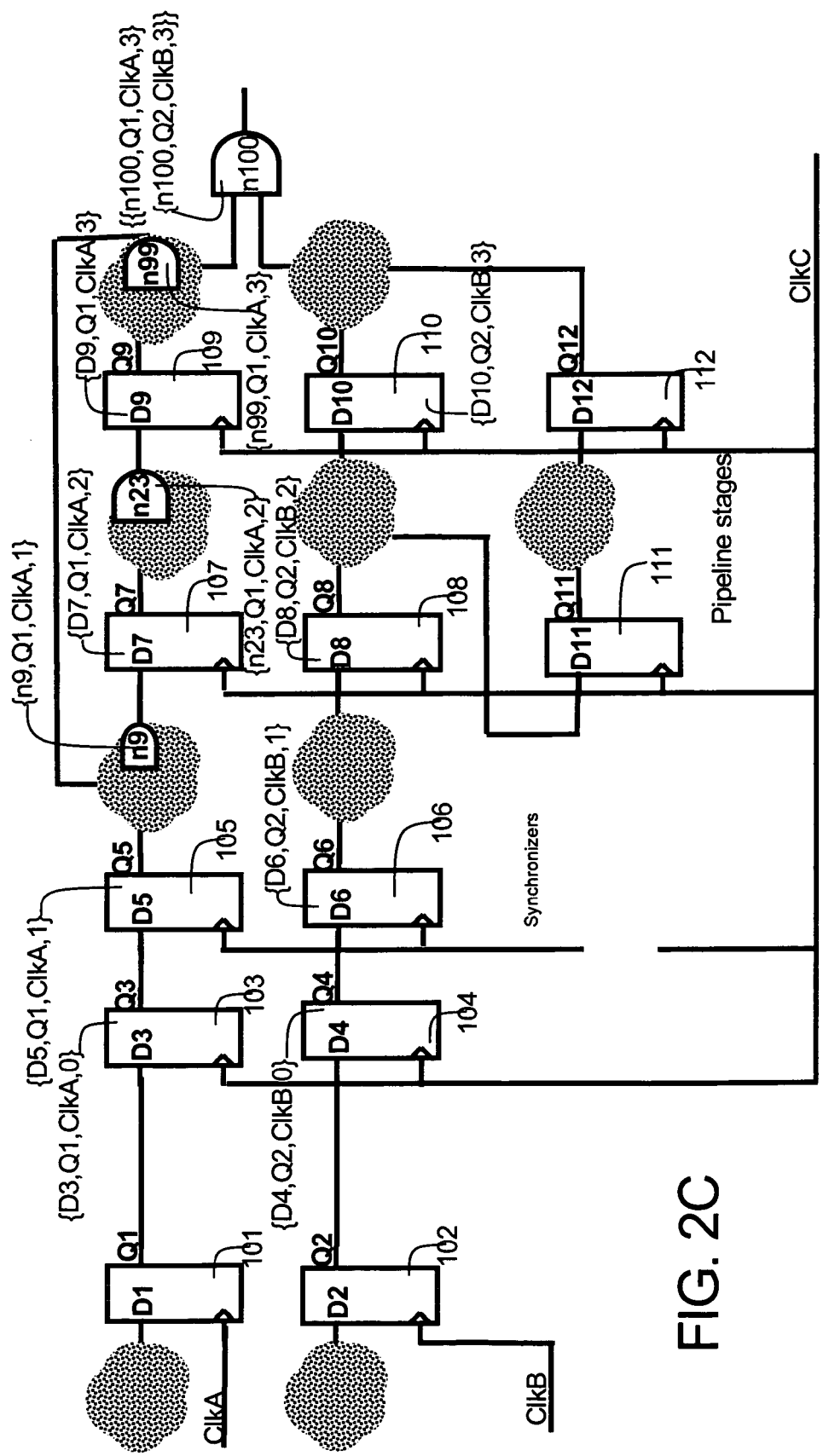

Propagation of signal name Q2 is performed in a similar manner, resulting in the tuples shown in FIG. 2C. Note that when signal name Q2 is propagated through AND gate 100, neither of the above-described two situations are present. Specifically, the pre-existing tuple {n100, Q1, ClkA, 3} does not contain the same signal name as Q2. When this situation arises, a list of tuples is formed, with the list containing the pre-existing tuple and the new tuple. For this reason, FIG. 2C shows gate n100 being associated with the list {{n100, Q1, ClkA, 3}, {n100, Q2, ClkB, 3}}. Thereafter, propagation of signal name Q2 is continued in the same manner as discussed above (e.g. until Q2 can no longer be propagated).

At this stage, each circuit element that is associated with more than one tuple is examined to see if the names of two signals from different clock domains converge at the circuit element. In the example illustrated in FIG. 2C, gate n100 does have names of signals that are clocked at two different clock frequencies ClkA and ClkB. Hence, gate n100 is flagged as being the point of convergence of signal names Q1 and Q2. Therefore, identification of the precise point of convergence, by a programmed computer of one embodiment has been described above in reference to FIGS. 2A-2C for the example circuit of FIG. 1A. As convergence of signal names indicates a corresponding convergence of signals themselves in a physical implementation (in an integrated circuit in the real world) of the circuit design, such a programmed computer may be used to identify converging signals depending on multiple clocks in a sequential boundary-less design.

In a number of embodiments of the type described herein, the digital circuit description (e.g. in a HDL such as Verilog or VHDL) is converted by a programmed computer into a typical data-structure representation of a circuit in a form of a graph where nodes represent the positional signals and edges represents circuit elements (also called "operators"). On this graph, all the signals form a set of positional signals that are represented by the first element in each quadruplet (i.e. 4-tuple) illustrated and described above in reference to FIGS. 2A-2C. Hence in these embodiments, the positional signals are not explicitly present in the tuple.

Instead, in many such embodiments, a data structure [S] for each node in the graph represents the positional signal, and this data structure contains a pointer to another data-structure [D] that represents the following quadruplet {[SPS] [CPS] [SQD] [*D]}. Specifically, the four elements of the just-described quadruplet represent the signal to be propagated (such as Q1 or Q2 in FIG. 2A), the clock frequency associated with the propagated symbol (such as ClkA or ClkB), the sequential depth of the propagated symbol, and a pointer to another data-structure of type [D]. The last-described element is a pointer that is used to form a circular list of these data-structures [D], for situations wherein multiple tuples are to be associated with a circuit element (e.g. n100 in FIG. 2C).

Although tuple propagation has been described above for several embodiments of the invention in reference to one specific application, namely detection of the convergence point, tuple propagation can be used for numerous other applications as will be apparent to the skilled artisan in view of the disclosure. For this reason, tuple propagation is now described in a generic fashion in reference to acts 301-316 of FIG. 3A. Specifically, a computer is programmed in many embodiments of the invention to perform acts 301-316, although the specific tuples to be propagated, the starting elements from which tuples are propagated, and analysis of the results of tuple propagation are different for each application. Note that a tuple is also referred to below as a symbol.

Referring to FIG. 3A, a tuple propagator, in the form of an computer (such as a Sun workstation or an IBM compatible personal computer) that is programmed as follows, starts by first initializing all pointers [S] to data structures [D], in a graph representing a digital circuit description of a circuit through which tuples are to be propagated. Thereafter, in act 301, the computer is programmed to copy a pointer to all wires (represented by positional signal [PS]), from which tuple propagation is to begin, into a queue. Locations from which tuple propagation is to begin may be selected for this computer, in accordance with any method, depending on the application. In the example illustrated in FIGS. 2A-2C, at this stage the queue contains [D3, D4]. Next, in act 302, the programmed computer checks if the queue is empty, and if so goes to act 303. Note tuple propagation has been completed at this stage (when performing act 303), and in some embodiments programmed computer returns tuples that are found to be intersecting (as described elsewhere herein), although other embodiments may perform other actions in act 303.

If in act 302, the queue is not empty, then control passes to act 304 and a temporary variable "S1" is set to the first element in the queue, e.g. D3. Then the first element in the queue is removed in act 305. Next, in act 306, another temporary variable "currentSymbol" is set to a pointer to a quadruplet {[SPS] [CPS] [SQD] [*D]} which is pointed to by S1. Thereafter, in act 307 another temporary variable "E" is set to whichever circuit element is in the forward direction of the current wire (identified by S1). In the example illustrated in FIGS. 2A-2C, at this stage, variable E is set to circuit element 105 (i.e. flip-flop 105). Next, in act 308, a signal identified by S1 is checked as to whether it is at the output of a sequential (i.e. clocked) element or not. If it at the output of a sequential element then a flag "SEQUENTIAL" is set in act 309. Regardless of whether sequential or not, control transfers to act 310 in which another temporary variable S2 is set to the output signal of whichever circuit element is currently identified by variable "E". In the example illustrated in FIGS. 2A-2C, at this stage, S2 is set to Q5 (since signal Q5 is output by flip-flop 105).

Then, in act 311, another temporary variable "newSymbol" is set to a pointer to the quadruplet {[SPS] [CPS] [SQD] [*D]} which is pointed to by S2. Thereafter a check is made in act 312 as to whether the newSymbol is null and if so, then act 313 is performed wherein S2 is set to currentSymbol (described above). Therefore, as per act 313, if an element in the circuit design is not currently identified with any signal passing therethrough, the quadruplet of the preceding element is now identified with the current element. In some embodiments, an attribute of the element (e.g. a pointer) merely identifies the quadruplet of the preceding element, although in other embodiments a physical copy of the preceding element's quadruplet is made (thereby taking up more memory). Embodiments that create an instance of data structure [D[ only when necessary are more efficient in using memory, and hence are more easily implemented in certain computers that may have very limited memory. Also, in act 313, if the flag "SEQUENTIAL" is set, then the sequential depth is incremented in which case a copy of the previous quadruplet is necessary. At this point, the flag SEQUENTIAL is also cleared (for future use). Note also that in act 313 a flag MODIFIED is set, for future use in act 315 as discussed below.

In act 312 if newSymbol is not null (e.g. at gate n100 in FIG. 2C after quadruplet containing Q1 has been propagated therethrough), then act 314 is performed to merge and reduce two quadruplet lists represented by newSymbol and currentSymbol. During the merge and reduce operation, duplicate quadruplets are eliminated from a combined list (obtained from the two lists). Quadruplets are treated as duplicates if all information is the same except for sequential depth. Also, the actions in act 314 relative to the SEQUENTIAL flag are same as that discussed above for act 312. During the merge and reduce operation, the flag MODIFIED is set to FALSE if the list of quadruplets in newSymbol is same before and after the operation. If there is a change (e.g. if new quadruplet(s) are added to newSymbol) then the flag MODIFIED is set to TRUE. The MODIFIED flag is used in act 315, to decide whether or not a current quadruplet (containing Q1) is to be further propagated.

Some embodiments implement act 314 by programming computers to perform acts 351-360 of FIG. 3B, to implement the merge and reduce operation on two singly-linked lists namely LIST1 and LIST2. In several such embodiments, each of lists LIST1 and LIST2 are implemented as circular lists which allow the lists to be easily merged using red-black trees of the type well known to a skilled programmer. Note that in FIG. 3B and the related description, the word "symbol" is used synonymously with the word "tuple." In act 351, the flag MODIFIED is set to FALSE. Thereafter, a set (called "SET1") is created in act 352, to hold all symbols from LIST1. Use of a set in these embodiments avoids having to traverse the singly-linked list, and therefore improves speed.

Next, in act 353, a symbol from LIST2 (called "SYMBOL1") is checked for presence in the just-described set. If present, act 354 is performed wherein the flag MODIFIED is set to TRUE. Thereafter, memory for a new symbol is allocated and initialized, thereby to create the new symbol in act 355 (called "SYMBOL2"). Then all information from SYMBOL1 is copied into SYMBOL2, in act 356. Then, in act 357, the sequential depth of SYMBOL2 is incremented (only if the flag SEQUENTIAL is set). Next, SYMBOL2 is linked, as per act 358, to any other new symbols that may have been created during this merge and reduce operation, or to any symbol that is currently present in the set SET. Next, in act 359 a check is made as to whether there are any more symbols in LIST2 and if so, control returns to act 353, and if appropriate more symbols are linked. In this manner, a combined list is formed, to contain non-redundant symbols from both lists LIST1 and LIST2. Finally, when no more symbols remain in LIST2, the flag MODIFIED is returned, in act 360.

Pseudo-code for the above-described implementation of act 314 is described as follows:

```
bool mergeSymbolsList (List1, List2, sequentialDepth) {
    set modified to false
    Create a Set1 with all elements in List1
    foreach Symbol1 in List2 {
        if (Symbol1 is not in Set1) {
            set modified to true
            Create new Symbol2
            Copy Symbol1 into Symbol2
            Increment sequentialDepth of Symbol2
            Link Symbol2 with other new symbols if any
        }
    }
    return modified
}
```

Referring back to FIG. 3A, regardless of the answer in act 312, act 315 is performed next (i.e. control transfers here from each of acts 313 and 314). Specifically, in act 315 a check is made as to whether the list represented by newSymbol has been modified (by testing the flag MODIFIED for TRUE), and if so the positional signal [PS] which is output by a circuit element pointed to by S2 is added to the queue. Note that the MODIFIED flag may be set to TRUE either due to merging of two lists (see act 314) or when newSymbol goes from null to having one quadruplet (see act 313). In the example of FIG. 2C, in act 315, the output wire/signal of gate n9 is added to the queue, because newSymbol went from null to one quadruplet.

Next, a check is made in act 316 as to whether the output of a circuit element that receivers S1 as input is supplied to any other circuit element (i.e. whether there are any forward operators), and if so control is returned to act 307 (discussed above). If not, then control is returned to act 302 (also discussed above). Note that when the MODIFIED flag is set to FALSE, i.e. if there is no change in the list of quadruplets pointed to by newSymbol, then propagation of the quadruplet stops.

Figure 4:
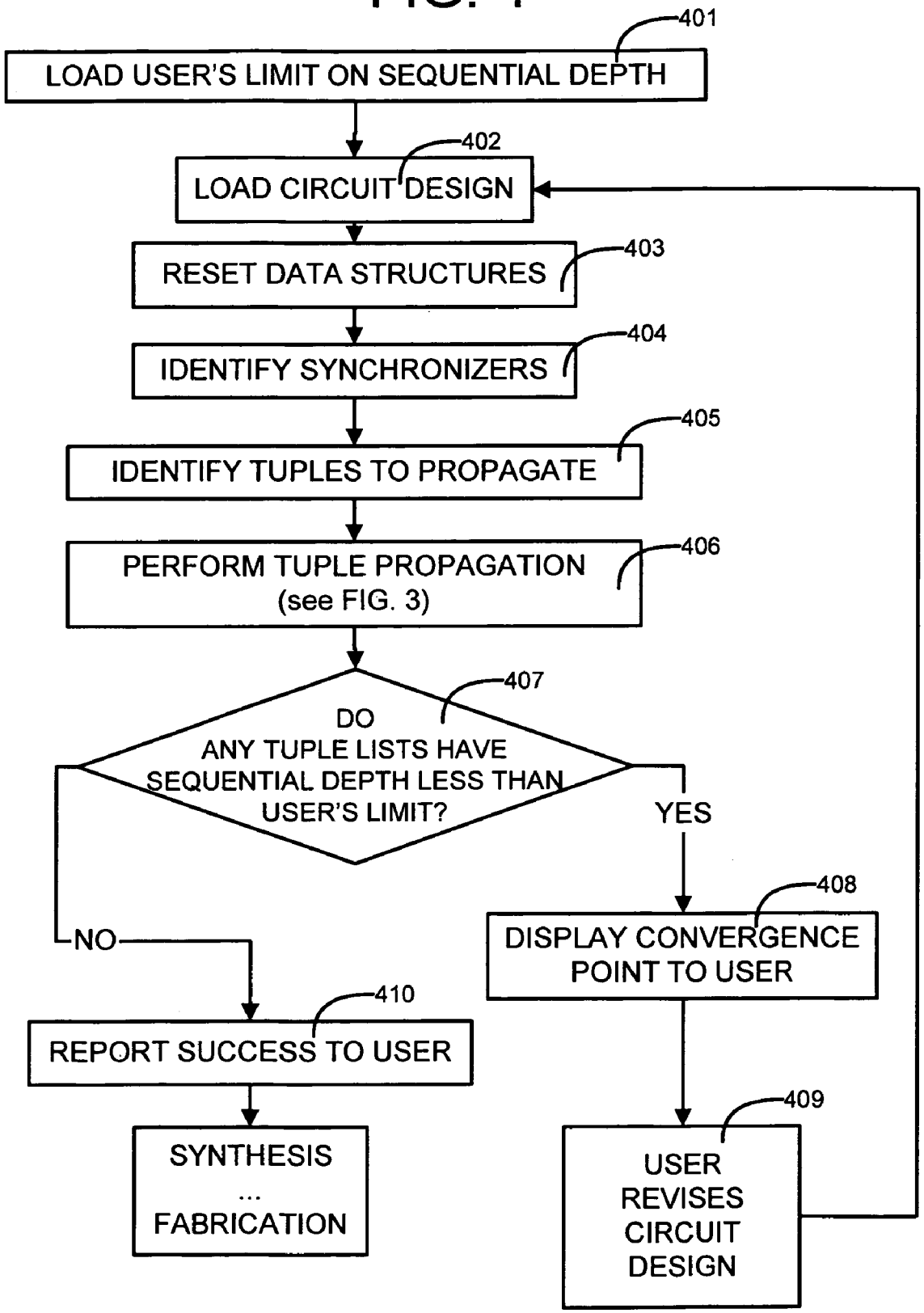
FIG. 4 illustrates, in a high-level flow chart, acts performed to use the method of FIG. 3A to identify points at which signals of different frequencies converge.

In some embodiments, a computer that is programmed to perform acts 301-316 as described above may be further programmed to detect convergence of two signals that originate in different clock domains as illustrated in FIG. 4 and described next. Specifically, in an act 401, the user's limit on sequential depth is loaded. The user may set a limit (e.g. 2 or 3 or 4) beyond which the user feels comfortable with convergence. Next, in act 402 a circuit design is loaded into this programmed computer.

Thereafter, in act 403, all data structures to be used in tuple propagation are reset (e.g. in case they were used in a previous iteration). Therefore at this stage, all positional signal pointers [S] to the data-structure [D] are empty. Next, in act 404 all synchronizers in the circuit design are automatically or manually identified. Synchronizers may be identified, for example, by looking for back-to-back flip-flops (e.g. two flip-flops that are connected to one another by a single wire) that are clocked at the same frequency, and further if preceded by another flip-flop clocked at a different frequency. Note that the just-described method is just one of several methods that may be used to find synchronizers, as will be apparent to the skilled artisan in view of this detailed description.

Next, in act 405, a positional signal for each tuple to be propagated is identified automatically. Specifically, the positional signal [PS] is set to point to the position of the first or last flip-flop in each synchronizer, depending on the embodiment. Furthermore, at this stage, an instance of the data-structure [D] is created for the circuit element identified (in a netlist) by [PS]. The newly-created instance of the data structure [D] is now filled with the information of the signal (e.g. Q1) to be propagated [SPS], its clock [CPS], a initial sequential depth [SQD] of 0 and this structure's internal pointer [*D] points to the instance of the data-structure itself, to implement a regular circular list. Note that the list of such data-structures is a singly-linked list which is circular.

Next, tuple propagation is performed in act 406 in the manner described above in reference to FIG. 3A. In some embodiments of act 406, a breadth first search is performed although in other embodiments of act 406 a depth first search may be performed (as per FIGS. 2A-2C). Note that an event-driven queue based method is performed in some implementations of tuple propagation. Other implementations based on graph levelization techniques are used in some embodiments, to improve performance.

Next, in act 407 a check is made as to whether any tuple lists have been formed and if so whether they are formed with tuples having a sequential depth less that the predetermined limit. If there are not such tuples, then in act 410 the programmed computer displays a message to the user about success in designing a mixed clock domain circuit that is free of convergence issues. On the other hand, if two or more pairs of such tuples exist, then act 408 is performed, to display precise convergence points in the digital circuit representation as identified by tuple lists having sequential depth less than the predetermined limit were found. Thereafter, in an act 409, the user revises their circuit design, based on the convergence information and returns to act 402.

Note that several embodiments save memory, by reusing the symbol lists for forward signals till two symbol lists need to be merged. In that case (during merger), new copies of symbol lists are created.

Figure 5:
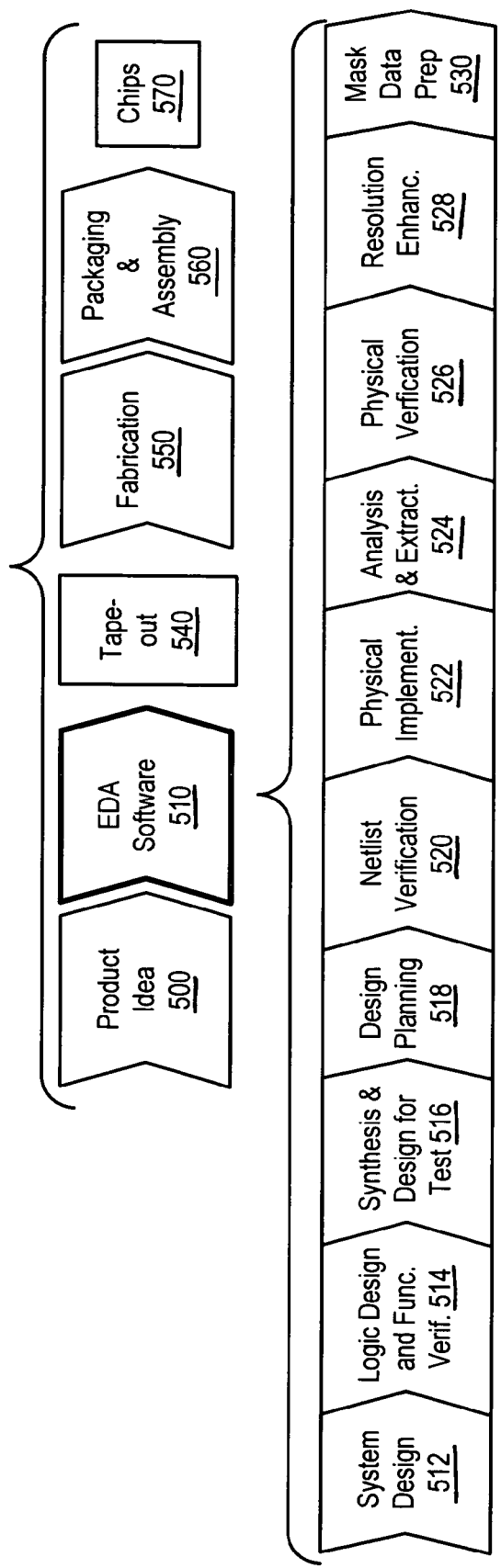
FIG. 5 illustrates, a simplified representation of an exemplary digital ASIC design flow in accordance with the invention.

It may be helpful to place this process in context. FIG. 5 shows a simplified representation of an exemplary digital ASIC design flow. At a high level, the process starts with the product idea (500) and is realized in a EDA software design process (510). When the design is finalized, it can be taped-out (event 540). After tape out, the fabrication process (550) and packaging and assembly processes (560) occur resulting, ultimately, in finished chips (result 570).

The EDA software design process (510) is actually composed of a number of stages 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components of the EDA software design process (stage 510) will now be provided:

System design (stage 512): The circuit designers 611 (FIG. 6) describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Figure 6:
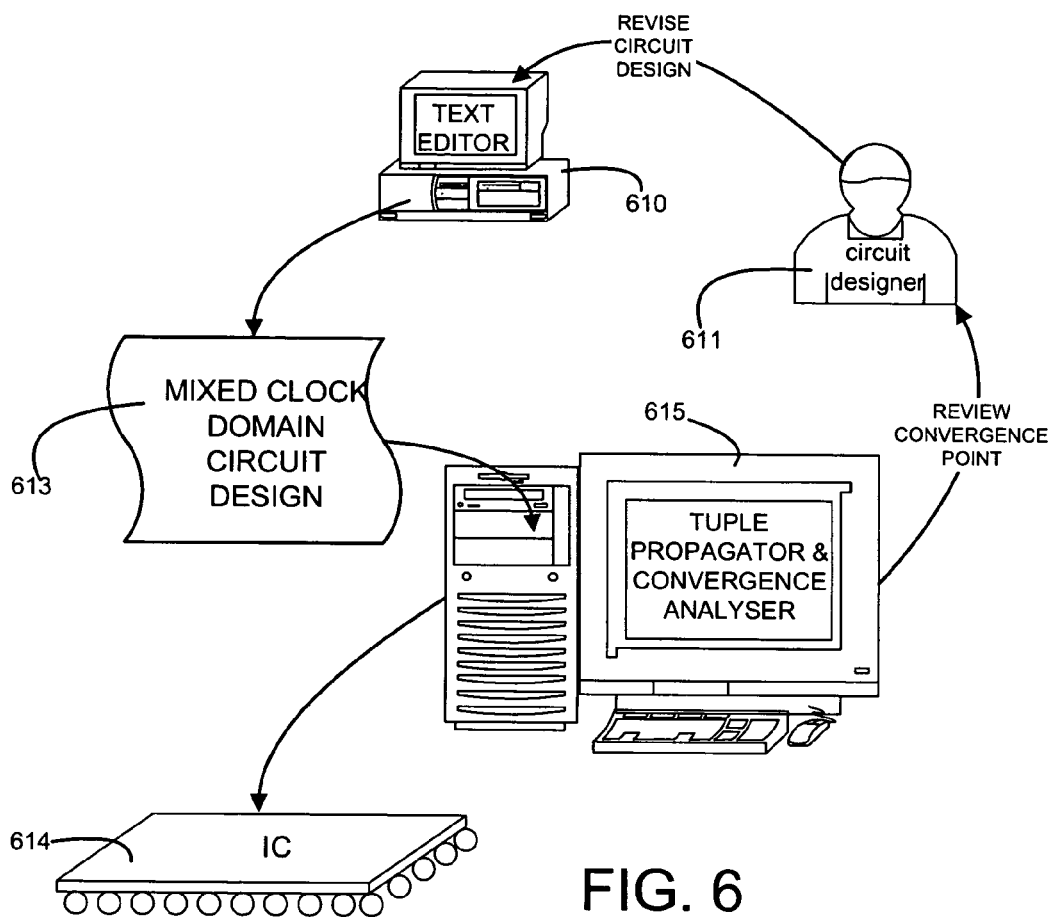
FIG. 6 illustrates flow of information during design of a circuit to avoid convergence within a predetermined limit in accordance with the invention.
Figure 7:
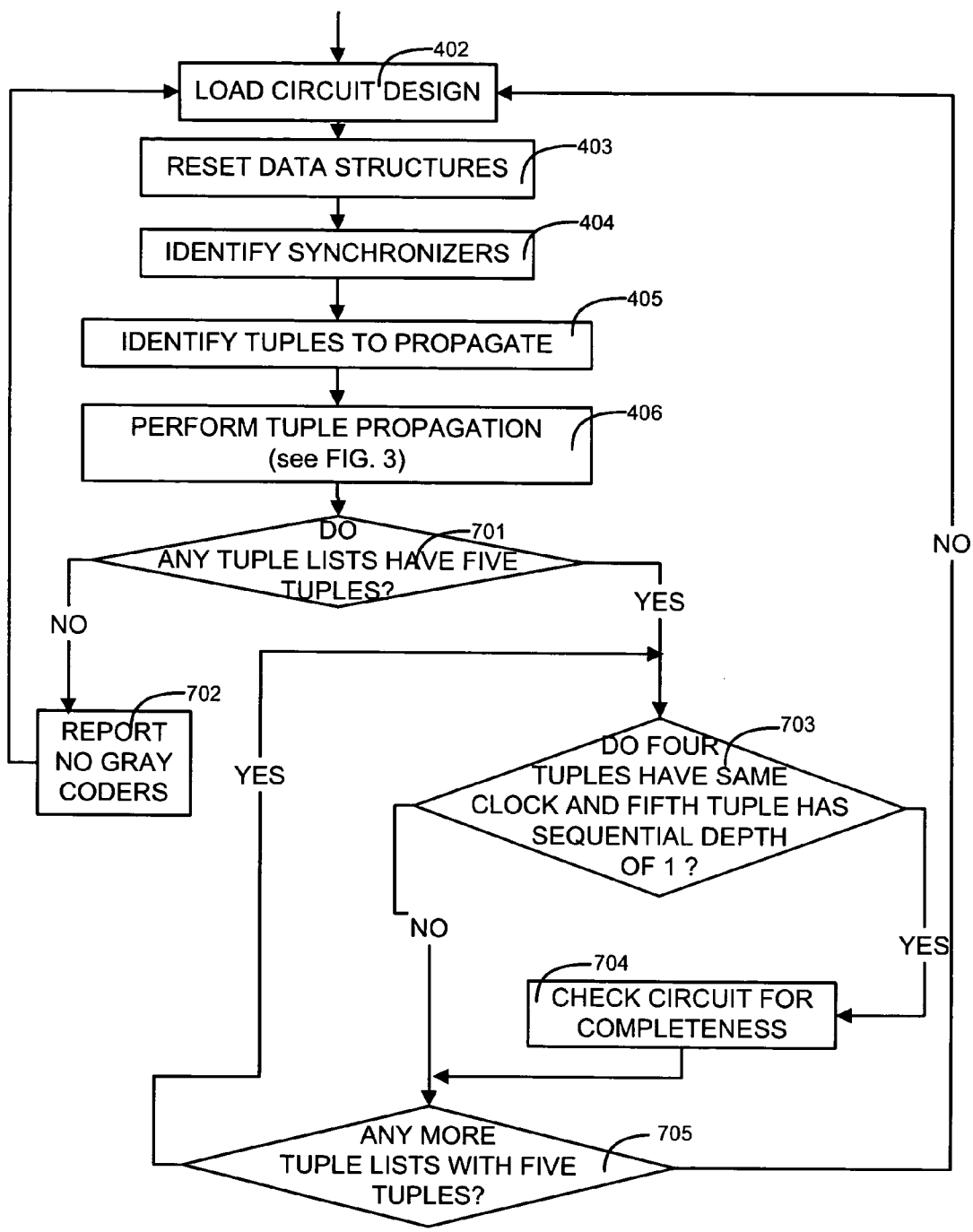
FIG. 7 illustrates, in a high-level flow chart, acts performed to use the method of FIG. 3A to identify Gray coders and decoders in a mixed clock domain circuit.

Logic design and functional verification (stage 514): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products. Specifically, as noted above in reference to FIG. 4, a LEDA tool, version 4.03 (or higher) may be used in some embodiments to perform rule checks for multiple clock domains (also called "mixed clock domains"), such as a convergence check to ensure that two or more synchronized signals of different frequencies that cross clock domains converge only after a predetermined sequential depth in the new clock domain. Note that various acts of the type described above in reference to FIGS. 3A and 4 and acts described below in reference to FIGS. 7 and 9 are performed in stage 514 of some embodiments. Hence, although circuitry and portions thereof (such as flip-flops and gates) are described herein as if they exist in the real world, it is to be understood that at this stage only a computer model of circuitry as described by the circuit designer exists in a programmed computer 615 (FIG. 6). The actual circuitry in the real world is created after this stage as discussed next.

Synthesis and design for test (stage 516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 518): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 520): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 522): The placement (positioning of circuit elements) and routing (connection of the same) occurs at this step. Exemplary EDA software products from Synopsys, Inc. that can be used at this stage include the Astro product.

Analysis and extraction (stage 524): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 526): At this various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 528): This involves geometric manipulations of the layout to improve manufacturability of the design. Exemplary EDA software products from Synopsys, Inc. that can be used at this include iN-Phase, Proteus, and AFGen products.

Mask data preparation (stage 530): This provides the "tape-out" data for production of masks for lithographic use to produce finished chips. Exemplary EDA software products from Synopsys, Inc. that can be used at this include the CATS(R) family of products.

FIG. 6 illustrates the flow of information in some embodiments, wherein a mixed clock domain circuit design 613 is analyzed by computer 615 that has been programmed to perform acts of the type illustrated in FIGS. 3A, 3B, 4, 7 and 9, and any results are then reviewed by chip designer 611. Chip designer 611 in turn revises the circuit design, by use of a text editor in a personal computer 610. Note that computer 610 may be a personal computer whereas computer 615 may be a Sun workstation of the type described in the Background section. Note that a single computer may be used instead of two computers. When the circuit designer 611 is satisfied that no convergence points are found by computer 615, then the circuit design 613 may be taped out for fabrication into an integrated circuit (IC) chip 614 in the normal manner.

Figure 1B:
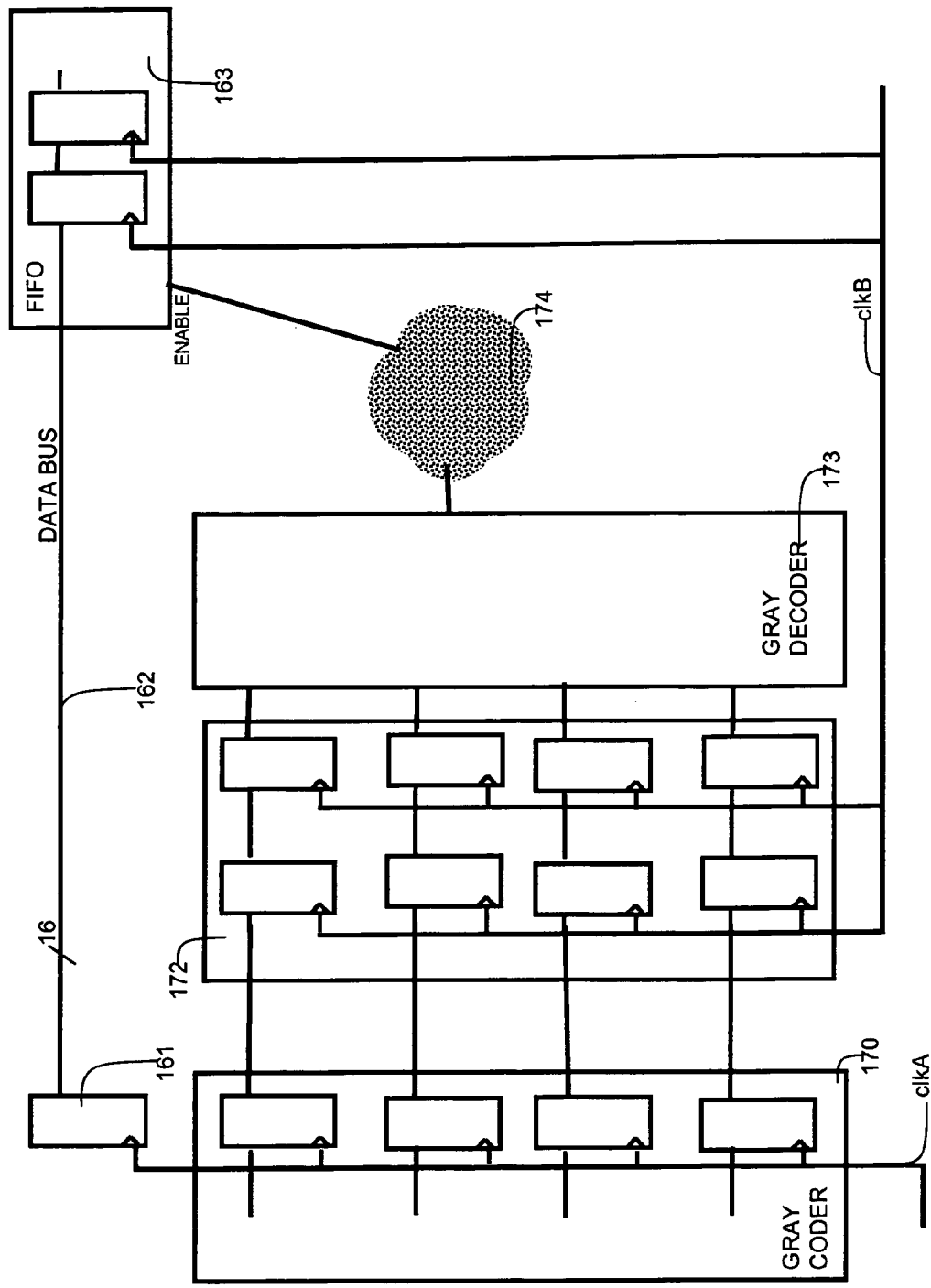
FIG. 1B illustrates, in another block diagram, circuit elements in another prior art circuit design of mixed clock domains.
Figure 8:
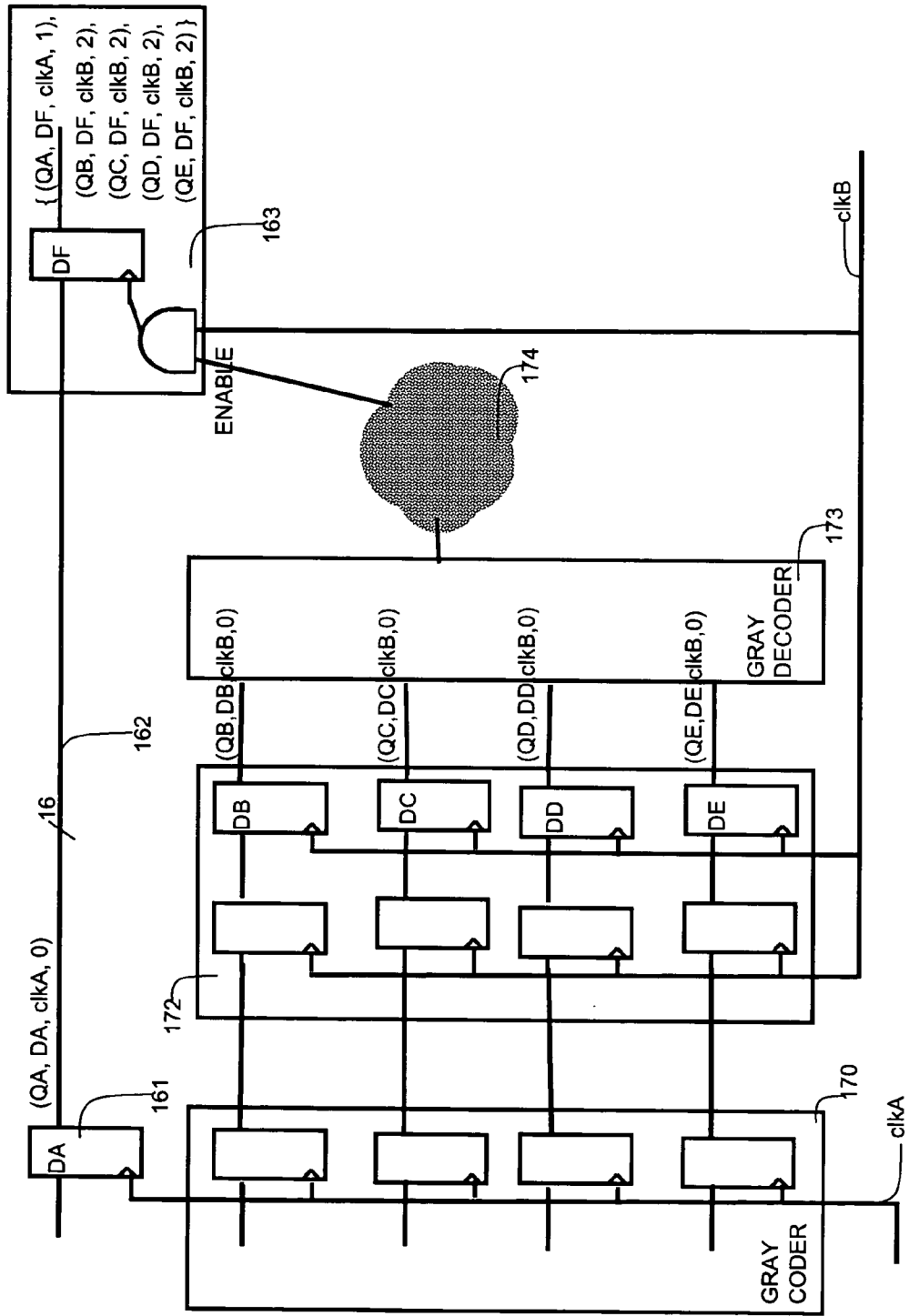
FIG. 8 illustrates the block diagram of FIG. 1B annotated with tuples that are propagated in accordance with the invention from synchronizers through the Gray decoder and the state machine, and a list of tuples obtained as a result of such propagation at the output of the first stage of the FIFO.

Although some embodiments to use the method of FIGS. 3A and 3B have been described above in reference to FIG. 4, several other embodiments will be apparent to the skilled artisan in view of the disclosure. In certain embodiments, the method of FIGS. 3A and 3B is used to identify Gray coders in a prior art circuit of the type illustrated in FIG. 1B, by performing certain acts of the type illustrated in FIG. 7. Specifically, in the method of FIG. 7, acts 402-406 that have been described above in reference to FIG. 4 are also performed by an appropriately programmed computer 615 (FIG. 6). For example, as illustrated in FIG. 8, synchronizers 172 are identified in act 404.

Thereafter, tuples to be propagated are prepared in act 405. In the example illustrated in FIG. 8, each tuple contains four elements, namely (1) the signal being propagated (such as QB, QC, QD and QE), (2) the positional signal of the current circuit element (such as the second flip-flop of synchronizers 172, which is identified as DB, DC, DD and DE), (3) the frequency at which the signal (1) is clocked (such as clkB for all flip-flops of synchronizers 172), and (4) sequential depth (e.g. 0 for the second flip-flops of synchronizers 172). Note that a tuple is also identified at flip-flop 161 that transmits the data signal on bus 162. Specifically, flip-flop 161 is associated with the following tuple (QA, DA, clkA, 0). As noted above, only one flip-flop (and hence one tuple) is shown although there are sixteen such flip-flops (and sixteen such tuples).

Next, the above-described tuples are each propagated through a model of the circuitry, as per act 406, in the manner illustrated and described in reference to FIGS. 3A and 3B. In reference to FIG. 8, on completion of tuple propagation, the first flip-flop in FIFO 163 is associated with a list of five tuples.

Next, programmed computer 615 performs act 701, to check if any tuple lists have five tuples. If none of the tuple lists associated with any of the circuit elements has five tuples, then act 702 is performed, wherein the circuit designer 611 (FIG. 6) is informed that there are no Gray coders. In such a case, programmed computer 615 simply returns to act 402 and loads the next circuit design to be analyzed.

In act 701 if even a single circuit element has a list of five tuples associated with it, then programmed computer 615 goes to act 703. Referring to FIG. 8, the first flip-flop in FIFO 163 has five tuples and hence programmed computer 615 performs act 703 in this example. In act 703, programmed computer 615 checks if four of the tuples have the same clock frequency, and if the fifth tuple has a different clock frequency. This is true in the example of FIG. 8 because the four tuples from synchronizers 172 have frequency clkB and the fifth tuple from flip-flop 161 has frequency clkA. If true, then the fifth tuple is also checked to ensure that the sequential depth is 1.

If the result of act 703 is true, then act 704 is performed to flag the gray coder, and related circuit elements for further analysis. In the example of FIG. 8, the fifth tuple (which is received from flip-flop 161) does have the sequential depth of 1 (because there are no sequential stages between FIFO 163 and flip-flop 161). Therefore, gray coder 170, synchronizers 172, gray decoder 173 and state machine 174 are all flagged for further analysis.

Regardless of whether act 704 is performed, or not, control transfers from act 703 to act 705 (i.e. regardless of the outcome of the test in act 703). In act 705, a check is made as to whether there are any more tuple lists which have five tuples. If there are some more such tuple lists, then control transfers to act 703 which is described above. If there are no more lists with five tuples, then control returns to act 402 (described above).

Note that a gray coder and its related circuit elements that are identified in act 704 of FIG. 7 may be analyzed for completeness and correctness, to ensure that the circuit designer 611 (FIG. 6) has not made certain common mistakes. The specific analysis that may be done on such circuitry is not a critical aspect of the invention. For example, an EDA tool called "Megellan" available from Synopsys, Inc. may be used to perform formal analysis on the identified circuitry.

Figure 10A:
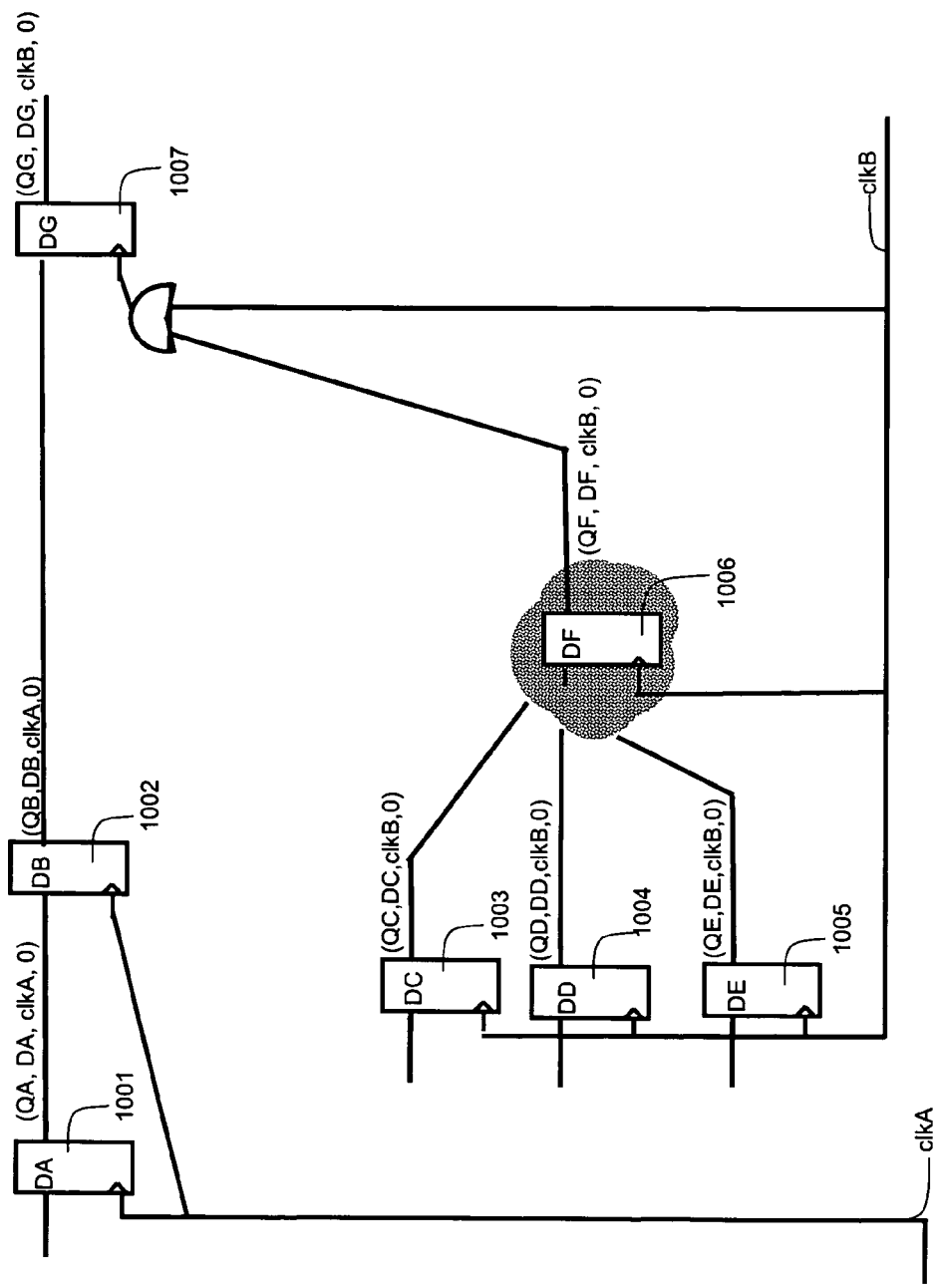
FIGS. 10A and 10B illustrate starting tuples and ending tuple lists from tuple propagation when applying the method of FIG. 9 in some embodiments of the invention, to find synchronizers in a circuit design.

Certain embodiments of programmed computer 615 perform acts illustrated in FIG. 9, to identify synchronizers in a circuit. Specifically, acts 402 and 403 are performed in the above-described manner, followed by act 901 in which flip-flops are identified. Thereafter, for each flip-flop, act 405 is performed to identify a tuple to be propagated. The tuples to be propagated in case of an example are illustrated in FIG. 10A. Next, tuple propagation is performed for exactly n cycles (e.g. two cycles), as per act 902. At the end of tuple propagation in the example of FIG. 2A, a number of tuple lists are now associated with several flip-flops as shown in FIG. 10B.

Thereafter, programmed computer 615 checks, as per act 903 whether all flip-flops have just one tuple, and if so circuit designer 611 is informed that there are no synchronizers as per act 908, and control returns to act 402 (described above). If there are any flip-flops associated with more than one tuple, then in act 904 a list is selected as being the current list. Then in the current tuple list, each tuple is checked as per act 905. Specifically, each tuple in a current list is checked as to whether a clock frequency identified in the tuple is different from the clock frequency of the current flip-flop (i.e. the flip-flop identified by the current positional signal). If so another check is made in act 905 as to whether the sequential depth is of a predetermined value, e.g. 2. If both conditions are satisfied then yet another test is made in act 905, whether the preceding flip-flop has the same clock frequency as the current flip-flop. If all three conditions are satisfied, then the current flip-flop and the preceding flip-flip are flagged as forming a synchronizer, for further analysis, as per act 906. Note that all tuples in the current list are checked in acts 905 and 906, and then act 907 is performed.

Regardless of whether act 906 is performed, or not, after all tuples in the current tuple list have been checked, control transfers to act 907. In act 907, a check is made as to whether there are any more tuple lists. If there are some more tuple lists, then one of the remaining tuple lists is selected as per act 905 which has been described above. If there are no more lists, then control returns to act 402 (described above).

Figure 10B:
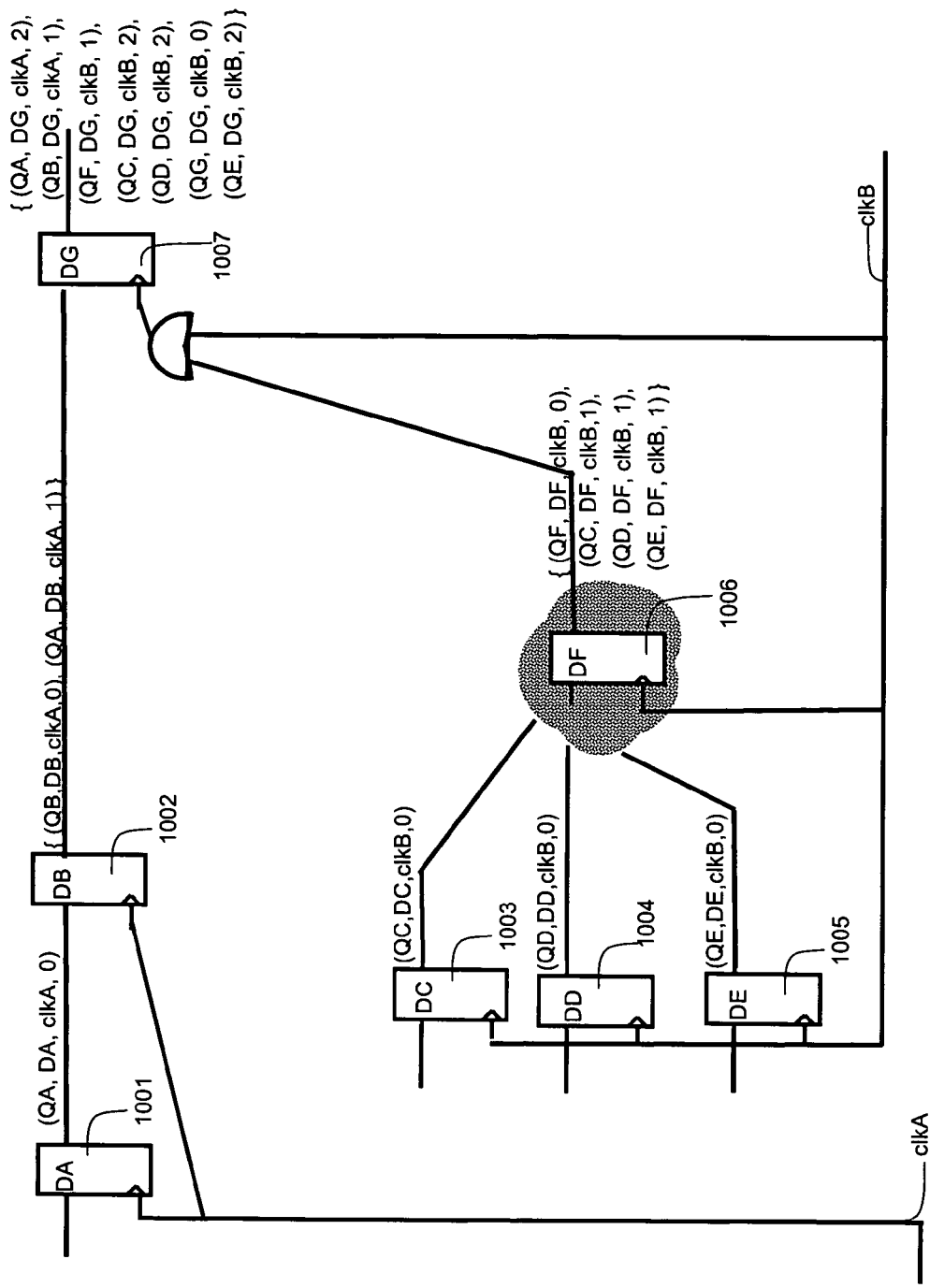

In the example illustrated in FIG. 10B, there are three flip-flops which have tuple lists with more than one tuple in them, namely flip-flops 1002, 1006 and 1007. Therefore, the tuple list of a flip-flop 1002 is set at the current tuple list, and in this case there are no tuples of different clock frequency and so nothing is flagged and the next iteration is performed. The tuple list of flip-flop 1006 is then set as the current tuple list and act 905 is performed. Here as well, no tuples are of different clock frequency, and so nothing is flagged and the next iteration is performed. The tuple list of flip-flop 1007 is then set as the current tuple list and act 905 is again performed. This time, there are two tuples of different clock frequency than the current clock frequency, namely tuple (QA, DG, clkA, 2) and tuple (QB, DG, clkA, 1). Only one of these tuples, namely tuple (QA, DG, clkA, 2) has the sequential depth 2. Hence the clock frequency clkB of flip-flop 1007 is now checked against the clock frequency of the preceding flip-flop 1002 which is clkA. Since the two frequencies are different, there is no synchronizer and nothing is flagged. In a different version of this circuit, if the two frequencies were the same, then flip-flops 1007 and 1002 would be flagged (as per act 906) as forming a synchronizer which may be further analyzed.

Circuitry around a synchronizer that is identified in act 906 may be analyzed for completeness and correctness, to ensure that the circuit designer 611 (FIG. 6) has not made certain common mistakes. The specific analysis that may be done on such circuitry is not a critical aspect of the invention.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process of FIG. 3A and/or FIG. 4.

Numerous modifications and adaptations of the embodiments described herein will become apparent to the skilled artisan in view of this disclosure. For example, although a queue is described above in reference to acts 302, 304 and 315 of FIG. 3A, a stack may be used in certain alternative embodiments. Moreover, the queue or stack may be implemented by use of either an array or a linked list, depending on the implementation. Also, while a tuple propagator may be used to (1) identify the point of convergence of signals of different clocks, (2) identify synchronizers and (3) identify Gray coders in the manner described above, numerous other applications of a tuple propagator will be apparent to the skilled artisan in view of this invention description. Furthermore, although in some applications, loop breaking is done when a propagated list of symbols does not contribute with more symbols than already present in the current symbol list attached to a positional signal (by not pushing the target signal into the queue), other applications may break such looping in any other manner that is apparent to the skilled artisan in view of this invention description. Moreover, although some embodiments reuse symbol lists during propagation until two symbol lists need to be merged other embodiments may be less efficient and create a new symbol list each time that a symbol is propagated. Also, although a tuple in the form of an object that holds two or more items is used in some embodiments, other embodiments propagate the individual items (such as signal name and sequential depth) in other forms.

Numerous modifications and adaptations of the embodiments described herein are encompassed by the scope of the invention.

What is claimed is:

1. A computer-implemented method of propagating a signal through a representation of a circuit design, the method comprising:

checking if an element in the circuit design is not currently identified with any signal passing through the element, to obtain a first result;

identifying a first tuple with the element when the first result is true;

wherein the first tuple comprises at least a name of said signal and sequential depth of the element through which said signal is being propagated;

checking if the element in the circuit design is currently identified with at least another tuple, to obtain a second result;

checking if every tuple currently identified with the element differs from the first tuple in the name of said signal when the second result is true, to obtain a third result; and identifying the first tuple with the element, in addition to every tuple currently identified with the element when the third result is true.

2. The method of claim 1 further comprising:

checking if every tuple currently identified with the element, and having the name of said signal, differs from the first tuple in frequency of said signal when the third result is false, to obtain a fourth result; and identifying the first tuple with the element, in addition to every tuple currently identified with the element when the fourth result is true.

3. The method of claim 1 further comprising:

checking if every tuple currently identified with the element and having the name of said signal has same frequency as the first tuple when the third result is false, to obtain a fourth result; and stopping propagation of said signal when the fourth result is true.

4. The method of claim 3 wherein each tuple also comprises a frequency, the method further comprising:

repeatedly performing at least said identifying with a plurality of elements in the circuit design; and checking if each element in the circuit design that is located within a predetermined sequential depth is currently identified with tuples of different frequencies, and if so displaying a message identifying said each element.

5. The method of claim 3 further comprising:

reporting success if no tuple lists are associated with any element in the circuit design having sequential depth less than a predetermined sequential depth.

6. The method of claim 3 wherein each tuple also comprises a frequency, the method further comprising:

repeatedly performing at least said identifying with a plurality of elements in the circuit design; and checking if any element in the circuit design is identified with five tuples, and if so checking if four tuples have identical frequency and if the fifth tuple has sequential depth of 1 and if so flagging the element as being a portion of a Gray coder.

7. The method of claim 3 wherein each tuple also comprises a frequency, the method further comprising:

performing at least said identifying exactly a predetermined number of times with a plurality of elements in the circuit design; and checking if any element in the circuit design is identified with a tuple of first frequency different from a second frequency at which the element is clocked, and if so checking if sequential depth is a predetermined value and if so checking if a preceding element is clocked at said second frequency and if so flagging the element and the preceding element as forming a synchronizer.

8. The method of claim 7 wherein:

the predetermined number is two; and the predetermined value is two.

9. A carrier wave encoded with instructions which when executed perform the method of claim 1.

10. A computer-readable storage medium encoded with instructions which when executed perform the method of claim 1.

11. The method of claim 1 wherein:

the sequential depth is measured from a boundary at which clock frequency changes.

12. The method of claim 11 further comprising:

using tuples identified with the element to identify a point of convergence of differently clocked signals.

13. The method of claim 11 further comprising:

using tuples identified with the element to identify location of gray coders.

14. The method of claim 11 further comprising:

using tuples identified with the element to identify location of synchronizers.

15. The method of claim 1 wherein:

each tuple further comprises a clock frequency and a positional signal.

16. A computer comprising a processor and a memory coupled to the processor, the memory being encoded with instructions to propagate a signal through a representation of a circuit design, wherein said instructions:

automatically check if an element in the circuit design is not currently identified with any signal passing through the element, to obtain a first result;

automatically identify a first tuple with the element in the circuit design, when the first result is true;

wherein the first tuple comprises at least a name of said signal and sequential depth of the element through which said signal is being propagated;

automatically check if the element in the circuit design is currently identified with at least another tuple, to obtain a second result;

automatically check if every tuple currently identified with the element differs from the first tuple in the name of said signal, when the second result is true; and automatically identify the first tuple with the element, in addition to every tuple currently identified with the element, if the result of automatic check is true.

17. An apparatus for propagating a signal through a representation of a circuit design, the apparatus comprising:

means for checking if an element in the circuit design is not currently identified with any signal passing through the element, to obtain a first result;

means for identifying a first tuple with the element in the circuit design, when the first result is true;

wherein the first tuple comprises at least a name of said signal and sequential depth of the element through which said signal is being propagated;

means for checking if the element in the circuit design is currently identified with at least another tuple, to obtain a second result;

means for checking if every tuple currently identified with the element differs from the first tuple in the name of said signal, when the second result is true; and means for identifying the first tuple with the element, in addition to every tuple currently identified with the element, if the means for checking indicates that result of checking is true.

18. A computer-implemented method of propagating a signal through a representation of a circuit design, the method comprising:

starting from a first element in the circuit design;

forming a first tuple using at least a name of a signal passing through the first element, and a first sequential depth of said first element from a boundary at which clock frequency changes in the circuit design;

identifying the first tuple with the first element;

proceeding to a second element in the circuit design to which the first element is immediately connected;

forming a second tuple using at least said name of said signal passing through said second element, and a second sequential depth of said second element from said boundary;

identifying the second tuple with said second element; and returning to the first element to update the first tuple.

19. The method of claim 18 wherein:

the second element is an AND gate; and the second sequential depth is identical to the first sequential depth.

20. The method of claim 18 wherein:

the second element is a flip-flop; and the second sequential depth is obtained by incrementing the first sequential depth by one.

* * * * *